(12) United States Patent
McCombs et al.

(10) Patent No.: US 8,553,472 B2
(45) Date of Patent: Oct. 8, 2013

(54) MEMORY WITH A SHARED I/O INCLUDING AN OUTPUT DATA LATCH HAVING AN INTEGRATED CLAMP

(75) Inventors: Edward M. McCombs, Austin, TX (US); Daniel C. Chow, Austin, TX (US); Kenneth W. Jones, Austin, TX (US); Alexander E. Runas, Austin, TX (US)

(73) Assignee: Apple Inc., Cupertino, CA (US)

( * ) Notice: Subject to any disclaimer, the term of this patent is extended or adjusted under 35 U.S.C. 154(b) by 63 days.

(21) Appl. No.: 13/311,340

(22) Filed: Dec. 5, 2011

(65) Prior Publication Data
US 2013/0141988 A1  Jun. 6, 2013

(51) Int. Cl.
*G11C 7/10* (2006.01)
(52) U.S. Cl.
CPC .................................. *G11C 7/1051* (2013.01)
USPC ...... 365/189.05; 365/226; 365/229; 365/227; 365/230.08

(58) Field of Classification Search
USPC ................ 365/189.05, 226, 229, 227, 230.08
See application file for complete search history.

(56) References Cited

U.S. PATENT DOCUMENTS

| 4,420,823 | A | 12/1983 | Shimada |
| 5,300,824 | A | 4/1994 | Iyengar |
| 5,369,613 | A | 11/1994 | Matsui |
| 6,181,611 | B1 | 1/2001 | Liu |
| 6,285,602 | B1 | 9/2001 | Tanida et al. |
| 7,352,639 | B2 | 4/2008 | Lamorey et al. |
| 2011/0309475 | A1* | 12/2011 | Lee ............................... 257/532 |

* cited by examiner

*Primary Examiner* — Thong Q Le
(74) *Attorney, Agent, or Firm* — Stephen J. Curran; Meyertons, Hood, Kivlin, Kowert & Goetzel, P.C.

(57) ABSTRACT

A memory includes a shared I/O unit that is shared between multiple storage arrays provides output data from the arrays. The shared I/O includes an output latch with an integrated output clamp. The I/O unit may be configured to provide output data from the storage arrays via data output signal paths. The I/O unit includes an output latch configured to force a valid logic level on the data output signal paths in response to a power down condition.

23 Claims, 4 Drawing Sheets

MEMORY WITH A SHARED I/O INCLUDING AN OUTPUT DATA LATCH HAVING AN INTEGRATED CLAMP

BACKGROUND

1. Technical Field

This disclosure relates to memories, and more particularly to shared memory I/O.

2. Description of the Related Art

Many memory devices include a number of storage arrays that share an input/output I/O circuit. For example, two or more arrays may share an I/O circuit that includes a sense amplifier. These storage arrays may often operate in voltage domains that are different from one another and which are also different than the voltage domain of the shared I/O. In many cases, the storage arrays and their associated circuits may be placed in retention mode or powered down altogether to save power. However, when an array is powered down or placed in retention there is no input to the sense amplifiers and the data output signal paths must be clamped to an appropriate valid signal level.

The clamping is typically done using a clamping stage after the output of an I/O latch circuit. Clamping stages may in some cases cause additional signal delay because they are in the signal path, and thus the critical path. Furthermore, the additional clamping stage may consume die area.

SUMMARY OF THE EMBODIMENTS

Various embodiments of a memory having a shared I/O with a latch including an integrated output clamp are disclosed. Broadly speaking, a memory that includes an I/O unit that is shared between multiple storage arrays is contemplated. The shared I/O provides output data from the arrays. The shared I/O includes an output latch with an integrated output clamp. In response to a power down indication, the integrated output clamp of the output latch may be configured to force a valid logic level on the plurality of data output signal paths.

In one embodiment, the memory includes a first storage array, and second storage array, and an input/output (I/O) unit coupled to the first storage array and the second storage array. The I/O unit may be configured to provide output data from the first storage array and the second storage array via data output signal paths. The I/O unit includes an output latch configured to force a valid logic level on the data output signal paths in response to receiving a power down indication.

In one specific implementation, the output latch may be powered by a switched supply voltage, and an unswitched supply voltage that is available whenever circuit power is available. The output latch includes a number of output driver circuits, each including an output inverter driver that may drive the output data onto a respective one of the data output signal paths. Each output driver circuit includes a p-type transistor coupled between an input of the output inverter driver and the unswitched supply voltage. The p-type transistor may provide a path from the unswitched supply voltage to the input of the output inverter driver in response to receiving the power down indication.

Figure 1:
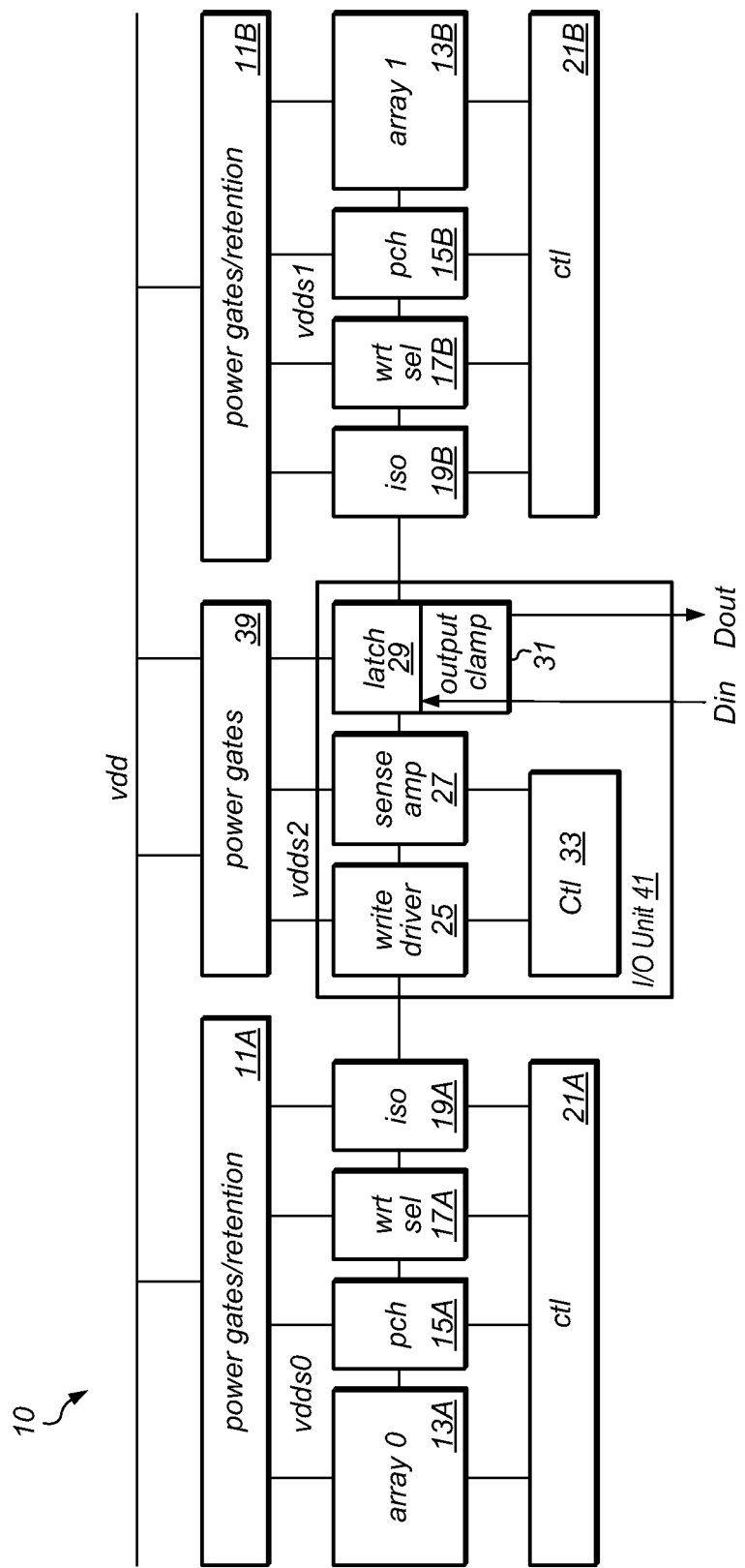
FIG. 1 is a block diagram of one embodiment of a memory.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of one embodiment of a memory is shown. The memory 10 includes a storage array 0, designated 13A, a storage array 1, designated 13B, and a shared input/output (I/O) unit 41. It is noted that components having a reference designator that includes both a number and a letter may be referred to using only the number where appropriate for simplicity.

In one embodiment, the shared I/O unit 41 may be configured to receive data on the Din data input and to control the writing of the data into one or both of the arrays 0 and 1. In addition, the shared I/O unit 41 may be configured to provide read data from the arrays 0 and 1 the Dout data output.

As shown in FIG. 1, to support the array 0 13A various components are provided. More particularly, the power gates/retention unit 11A may provide a switched voltage domain (e.g., vdds0) to the components associated with array 0. As such, the power gates/retention unit 11A may be configured to completely switch or gate off the Vdd power rail from the switched voltage domain vdds1, or the power gates/retention unit 11A may be configured to lower the voltage of the switched voltage domain to a retention voltage that may maintain the data in the array 0,when array 0 is inactive. In addition, a pre-charge circuit (e.g., pch 15A) may be used to precharge the bitlines (not shown) of the array 0,and the write select circuit (e.g., wrt sel 17A) may provide write control signals to the array 0. The isolation unit (e.g., iso 19A) may be configured to isolate the array 0 when the array 1 is being accessed Likewise, to support the array 1 13B various similar components are provided. For example, the power gates/retention unit 11B may provide another switched voltage domain (e.g., vdds1) to the components associated with array 1 as described above. In addition, the pre-charge circuit (e.g., pch 15B may be used to precharge the bitlines (not shown) of the array 1, and the write select circuit (e.g., wrt sel 17B) may provide write control signals to the array 1. The isolation unit (e.g., iso 19B) may be configured to isolate the array 1 when the array 0 is being accessed. The control units (e.g., ctl 21A and ctl 21B) may be configured to control read and write operations to their respective arrays 13.

In addition, the shared I/O unit 41 operates on yet another switched voltage domain (e.g. vdds2), which is provided through power gates 39. As above, the power gates 39 may be configured to switch off the switched voltage domain vdds2 to power down the I/O unit 41. The I/O unit 41 includes a write driver 25 that may be configured to provide the drive current for writing data into array 0 or array 1. The sense amp 27 may be configured to sense the voltage differential on the bitlines of the array 0 or array 1 and provide for output a data signal that corresponds to the differential signal. The latch 29 may be configured to latch and output the data signals provided by the sense amp 27. The output clamp circuit 31 may be configured to clamp the Dout signal paths to a valid logic value when the I/O unit 41 is powered down by the power gates 39. The output clamp 31 may include clamping circuits with sufficient drive strength to drive the Dout signal paths to the valid logic levels. The control unit (e.g., ctl 33) may be configured to control read and write operations for the shared I/O unit 41.

Figure 2:
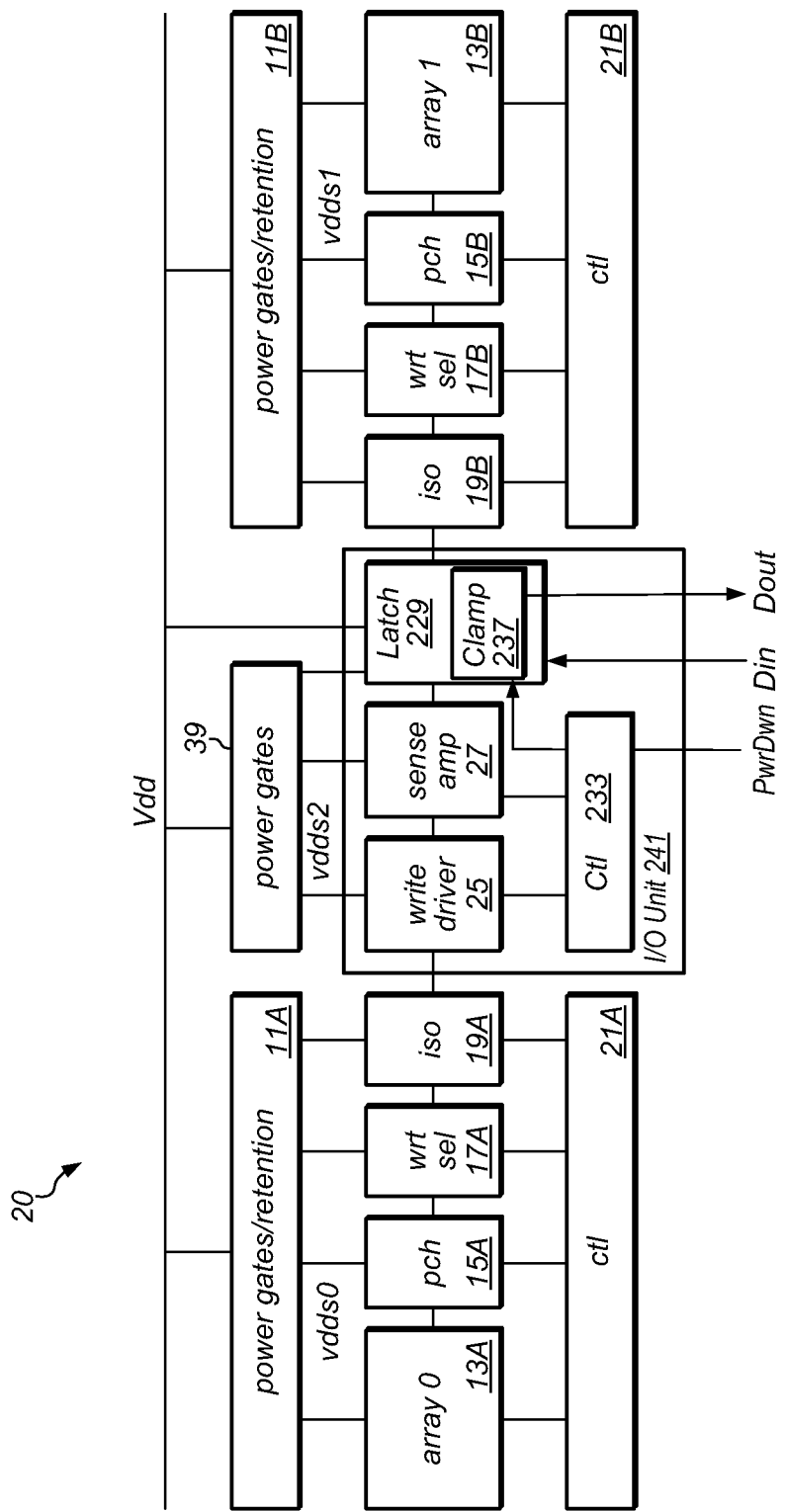
FIG. 2 is a block diagram of another embodiment of a memory including an output data latch having an integrated clamp.

Referring to FIG. 2, a block diagram of another embodiment of a memory is shown. Components shown in FIG. 2 that are the same as those shown in FIG. 1 are numbered identically for clarity. The memory 20 of FIG. 2 includes circuits that are similar to the circuits shown in memory 10 of FIG. 1 with a couple of notable exceptions. It is those exceptions that will be described in detail below in conjunction with FIG. 2. More particularly, the arrays 0 and 1 along with their respective associated circuits are similar to those shown in FIG. 1. Similarly, the write driver 25 and sense amp 27 are also similar. The power gates 39 are similar, but as shown, although the switched voltage domain vdds2 is coupled to the latch 229, latch 229 is also coupled to the unswitched Vdd rail. In addition, as described further below, the latch 229 includes an integrated clamp unit 237, rather than a separate external output clamp circuit. Lastly, the control unit 233 is different from the ctl 33 of FIG. 1 and is configured to receive a power down (e.g., PwrDwn) indication and to provide that indication to the latch 229.

In one embodiment, to save power one or both of the arrays 0 and 1 may be powered off or placed in retention mode during periods of inactivity. Retention mode typically refers to operating the memory arrays at a voltage that is less than the operating voltage. In many cases, the lower operating voltage is used to retain the data in the arrays, but the arrays are inactive. In addition, if both arrays 0 and 1 become inactive it may be desirable to also power down the I/O unit 241 to save additional power. Alternatively, the entire memory 20 may be powered down. In either case, if the I/O unit 41 is powered down, it may be necessary to continue to provide valid logic level signals on the data out (Dout) signal paths. Otherwise, the Dout signals may float to a non-valid signal level. In such cases, the downstream logic may operate in an unspecified manner with unpredictable results.

Accordingly, as described in greater detail below in conjunction with the description of FIG. 3, the integrated output clamp 237 may be configured to provide a valid logic level on the Dout signals, even when much of the remainder of the shared I/O unit 41 is powered down.

Figure 3:
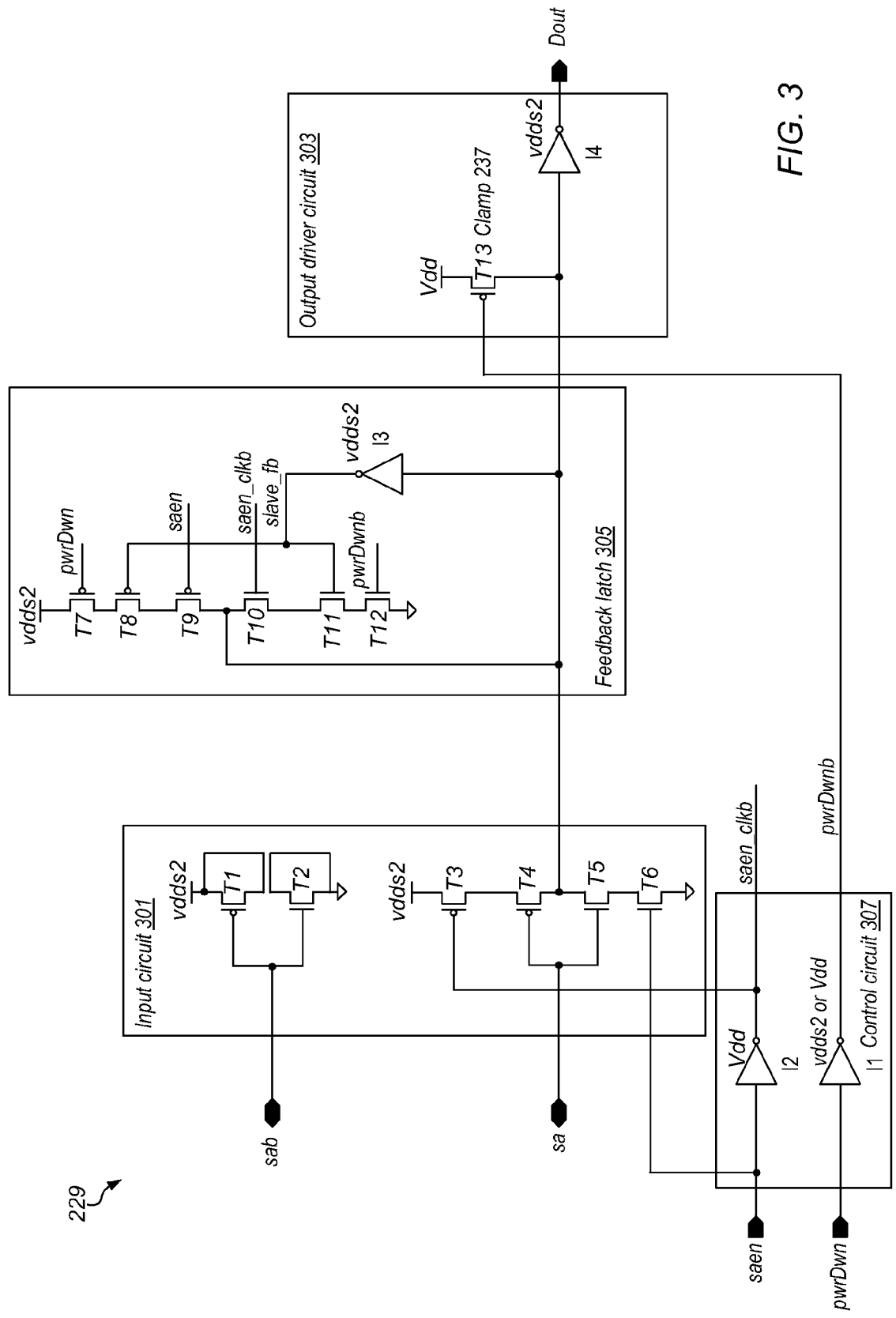
FIG. 3 is a schematic diagram of one embodiment of the output data latch of FIG. 2.

Turning to FIG. 3, a schematic diagram of one embodiment of the output data latch of FIG. 2 is shown. The output data latch 229 includes an input circuit 301 coupled to an output circuit 303, a feedback latch 305 and a control circuit 307.

As shown, the input circuit 301 includes transistors T3, T4, T5, and T6, of which transistors T4 and T5 form an input inverter for the 'sa' signal, and transistors T1 and T2 which form a tri-state gate for the 'sab' signal. However, since in the illustrated embodiment the sab signal is not used, the transistors T1 and T2 are simply used as impedance matching transistors and are thus tied off. In one embodiment, transistors T3 and T6 have a dual role. During normal operation, they create a high impedance inverter, which includes transistors T4 and T5, with a floating output when the sense amp is not providing a data signal on the sa signal path. Transistors T6 and T3 are controlled by the sense amp enable signal (e.g., saen) and the inverted sense amp enable signal (e.g., saen_clkb), respectively, which is provided by the inverter I2 in the control circuit 307. When the sense amp is actively providing input data on the sa signal path, the saen signal is driven to a logic value of one thereby enabling the T3 and T6 transistors which allows transistors T4 or T5 to provide inverted sa data to the input of the output driver circuit 303. In addition, as described further below, since the input circuit 301 is powered by the vdds2 voltage domain, transistor T3 prevents voltage from the Vdd voltage domain from back-powering the vdds2 voltage domain through transistor T4 when the vdds2 domain is powered down. Similarly, transistor T6 prevents current from flowing from the Vdd voltage domain to the circuit ground reference through transistor T5.

The feedback latch circuit 305 is configured to latch the input data value on the sa input onto the Dout data path. The feedback latch circuit 307 includes transistors T7 through T12, and inverter I3. Transistors T8 and T11 form a latch inverter. Transistors T9 and T10 enable the latch inverter to latch the inverted input value and are controlled by the saen and saen_clkb signals. All the devices in the feedback latch 305 are powered by the vdds2 voltage domain. In one embodiment, when the sa input data is provided to the input circuit 301, the saen signal is at a logic value of one, and the saen_clkb signal is at a logic value of zero, and thus transistors T9 and T10 are off. The pwrDwn and pwrDwnb signals are at logic values of zero and one, respectively, and thus transistors T7 and T12 are on. Accordingly, the input data is inverted and applied to the input of the output inverter driver I4, which inverts and drives the output data onto the Dout signal path. At some subsequent point in time, the saen signal will transition to a logic zero. This causes the inverted input data to be latched through inverter I3 and the transistor stack of T7 through T12. For example, if the input data on sa is a logic value of zero, then a logic value of zero is provided to the gates of transistors T8 and T11, thereby turning on transistor T8. Since transistors T7 and T8 are on, when the saen signal transitions to a logic value of zero, transistor T9 will turn on, allowing the output of the input inverter to be pulled up to the vdds2 voltage domain voltage, thereby reinforcing the inverted input signal value, which is in this case, a logic value of one. In contrast, if the input data on sa is a logic value of one, then a logic value of one is provided to the gates of transistors T8 and T11, thereby turning on transistor T11. Since transistors T11 and T12 are on, when the saen_clkb signal transitions to a logic value of one, transistor T10 will turn on, allowing the output of the input inverter to be pulled down to the circuit ground reference, thereby reinforcing inverted input signal value, which is in this case, a logic value of zero.

The transistors T7 and T12 perform a function that is similar to one function of transistors T3 and T6. More particularly, in one embodiment, when the vdds2 domain is powered down, since the feedback latch 305 is powered by the vdds2 voltage domain, transistor T7 prevents voltage from the Vdd voltage domain from back-powering the vdds2 voltage domain through transistors T8 and T9. Similarly, transistor T12 prevents current from flowing from the Vdd voltage domain to the circuit ground reference through transistors T10 and T11.

The output driver circuit 303 includes the output inverter driver I4 and a p-type transistor T13, which in one embodiment corresponds to the clamp 237 from FIG. 2. The transistor T13 is coupled between the Vdd voltage domain and the input to the output inverter driver I4. The gate of the transistor T13 is coupled to a power down signal (e.g., PwrDwnb) that is provided by the inverter I1 of the control circuit 307. In one embodiment, as described above during normal operation, the output inverter driver I4 inverts the data signal from the input inverter and provides drive current on the Dout data path. However as shown, the output inverter driver I4 is powered by the vdds2 voltage domain. Accordingly, to prevent the Dout signal path from floating to a non-valid logic value during a power down of the vdds2 voltage domain, the PwrDwnb signal may be driven to a logic value of zero. This forces the input of the output inverter driver I4 to Vdd. Since the transistor T13 is coupled to the Vdd voltage domain and the Vdd voltage domain is an always-on, unswitched voltage domain, the input to the output inverter driver I4 is pulled up to a logic value of one, which forces a logic value of zero onto the Dout data path.

In one embodiment, the transistor T13 is a small transistor with a small drive strength when compared to the p-type transistor (not shown) within the output inverter driver I4. Thus, there is very little leakage current through T13 when it is turned off. In addition, by pulling up the input of the output inverter driver I4, the n-type transistor (not shown) within the output inverter driver I4 is conducting to pull the Dout signal path down to the circuit ground reference. Further, because the vdds2 domain is powered down, there is virtually no leakage current in the output inverter driver I4.

It is noted that the latch 229 of FIG. 3 represents only one slice or bit of data of possibly a multi-bit data path. Accordingly, in other embodiments, the latch 229 may include as many of the circuits shown in FIG. 3 as there are data bits in the data path.

Figure 4:
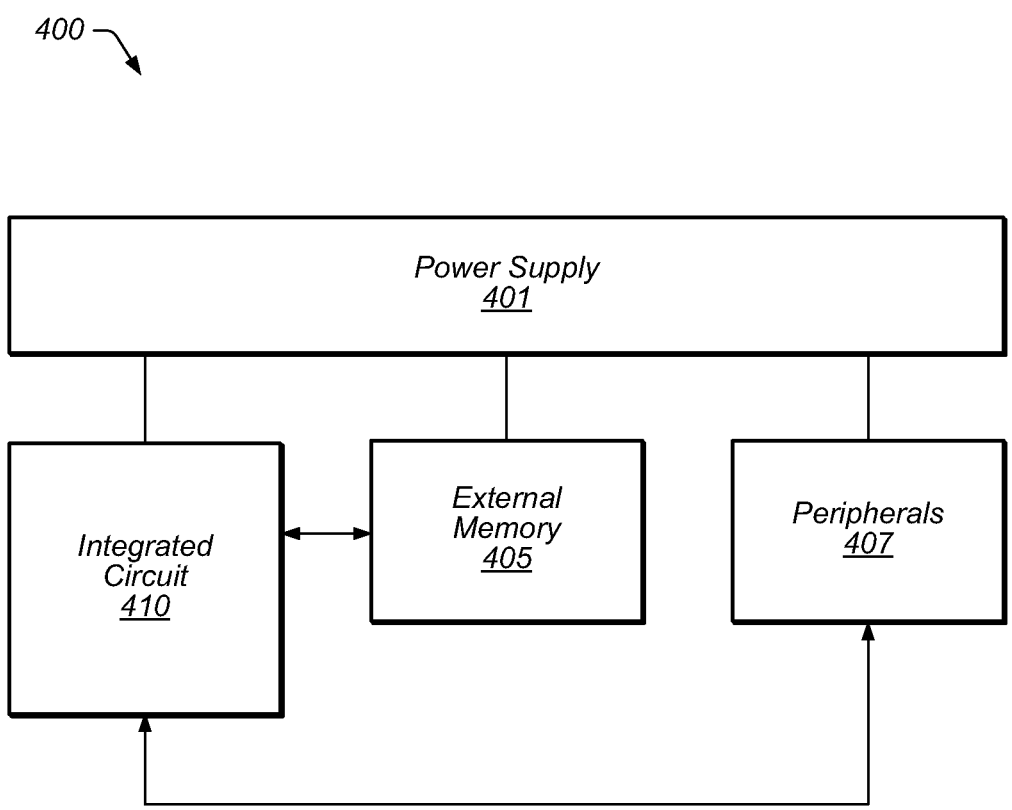
FIG. 4 is a block diagram of one embodiment of a system.

Referring to FIG. 4, a block diagram of one embodiment of a system is shown. The system 400 includes at least one instance of an integrated circuit 410 coupled to one or more peripherals 407 and an external system memory 405. The system 400 also includes a power supply 401 that may provide one or more supply voltages to the integrated circuit 410 as well as one or more supply voltages to the memory 405 and/or the peripherals 407.

In one embodiment, the integrated circuit 410 may be a system on a chip (SOC) including one or more instances of a processor, and various other circuitry such as a memory controller, video and/or audio processing circuitry, on-chip peripherals and/or peripheral interfaces to couple to off-chip peripherals, etc. Accordingly, the integrated circuit 410 may include one or more instances of an embedded memory such as memory 20 of FIG. 2. Thus, embodiments that include the memory 20 may also include a latch such as latch 229 of FIG. 3, which includes an integrated output clamp.

The peripherals 407 may include any desired circuitry, depending on the type of system. For example, in one embodiment, the system 400 may be included in a mobile device (e.g., personal digital assistant (PDA), smart phone, etc.) and the peripherals 407 may include devices for various types of wireless communication, such as WiFi, Bluetooth, cellular, global positioning system, etc. The peripherals 407 may also include additional storage, including various types of RAM storage, solid-state storage, or disk storage. As such, the peripherals 407 may also include RAM that includes a shared I/O unit with a latch having an integrated output clamp described above. The peripherals 407 may include user interface devices such as a display screen, including touch display screens or multitouch display screens, keyboard or other input devices, microphones, speakers, etc. In other embodiments, the system 400 may be included in any type of computing system (e.g. desktop personal computer, laptop, workstation, net top etc.).

The external system memory 405 may be representative of any type of memory. For example, the external memory 405 may be in the DRAM family such as synchronous DRAM (SDRAM), double data rate (DDR, DDR2, DDR3, etc.), or any low power version thereof. However, external memory 405 may also be implemented in SDRAM, static RAM (SRAM), or other types of RAM, etc. Accordingly, external system memory 405 may also include a shared I/O unit with a latch having an integrated output clamp as described above in conjunction with the description of FIG. 2 and FIG. 3.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A memory comprising:
   a first storage array;
   a second storage array;
   an input/output (I/O) unit coupled to the first storage array and the second storage array, wherein the I/O unit is configured to provide output data from the first storage array and the second storage array via a plurality of data output signal paths;
   wherein the I/O unit includes an output latch configured to force a valid logic level on the plurality of data output signal paths in response to receiving a power down indication.

2. The memory as recited in claim 1, wherein the output latch is coupled to a switched supply voltage, and an unswitched supply voltage that is available whenever circuit power is available.

3. The memory as recited in claim 2, wherein the output latch includes a plurality of output driver circuits, each including an output inverter driver configured to drive the output data onto a respective one of the plurality of data output signal paths, wherein each of the output driver circuits further includes a first p-type transistor coupled between an input of the output inverter driver and the unswitched supply voltage, and wherein the first p-type transistor is configured to provide a path from the unswitched supply voltage to the input of the output inverter driver in response to receiving the power down indication.

4. The memory as recited in claim 3, wherein the power down indication indicates that the switched supply voltage is powering off.

5. The memory as recited in claim 4, wherein the power down indication indicates that both of the first or the second storage arrays are being placed an inactive state, wherein the inactive state corresponds to a state in which an operating voltage is lowered from a normal operating voltage level to a retention voltage level that allows data in the first or the second storage arrays to be maintained and in which there are no memory accesses.

6. The memory as recited in claim 4, wherein the output latch includes a second p-type transistor and an n-type transistor coupled in series with an input inverter gate between the switched supply voltage and a circuit ground reference, wherein an output of the input inverter gate is coupled to the input of the output inverter driver, and wherein the second p-type transistor and the n-type transistor are configured to turn off in response to the first and the second storage arrays being placed in an inactive state, thereby removing a current path from the unswitched voltage supply through the input inverter to circuits coupled to the switched voltage supply, and removing a current path from the unswitched voltage supply through the input inverter to the circuit ground reference.

7. The memory as recited in claim 4, wherein the output latch includes a second p-type transistor and an n-type transistor coupled in series with a feedback circuit between the switched supply voltage and a circuit ground reference, wherein the second p-type transistor and the n-type transistor are configured to turn off in response to receiving the power down indication, thereby removing a current path from the unswitched voltage supply through the feedback circuit to circuits coupled to the switched voltage supply, and removing a current path from the unswitched voltage supply through the feedback circuit to the circuit ground reference.

8. The memory as recited in claim 1, wherein the valid logic level corresponds to a voltage level at which downstream logic is able to detect without ambiguity that the voltage level is either a logic value of one or a logic value of zero.

9. A memory comprising:
a first storage array;
a second storage array;
an input/output (I/O) unit shared between the first and the second storage arrays and configured to provide output data from the first storage array and the second storage array via a plurality of data output signal paths;
wherein the I/O unit includes an output latch configured to force a valid logic level on the plurality of data output signal paths in response to a first voltage domain that powers a first portion of the output latch being powered down.

10. The memory as recited in claim 9, wherein a second portion of the output latch is coupled to an unswitched voltage domain that is available whenever circuit power is available.

11. The memory as recited in claim 10, wherein the output latch includes a plurality of output inverter drivers, each configured to drive the output data onto a respective one of the plurality of data output signal paths, wherein each output driver circuit further includes a first p-type transistor coupled between an input of the output inverter driver and the second voltage domain, and wherein the p-type transistor is configured to provide a path from the second voltage domain to the input of the output inverter driver in response to the first voltage domain being powered down.

12. The memory as recited in claim 9, wherein the valid logic level corresponds to a logic value of zero.

13. The memory as recited in claim 9, wherein the first and the second storage arrays are powered by a second voltage domain that is separate from the first voltage domain.

14. An integrated circuit comprising:
a memory;
an unswitched power rail configured to provide power to an unswitched voltage domain as long as voltage is applied to the integrated circuit; and
a first power gating circuit coupled to the unswitched power rail and configured to provide a first switched voltage domain;
wherein the memory includes:
a first storage array;
a second storage array;
an input/output (I/O) unit coupled to the first storage array and the second storage array, wherein the I/O unit is configured to provide output data from the first storage array and the second storage array via a plurality of data output signal paths;
wherein the I/O unit includes an output latch configured to force a valid logic level on the plurality of data output signal paths in response to a first switched voltage domain that powers a first portion of the output latch being powered down.

15. The integrated circuit as recited in claim 14, wherein a second portion of the output latch is coupled to the unswitched voltage domain.

16. The integrated circuit as recited in claim 14, wherein the output latch includes a plurality of output inverter drivers, each configured to drive the output data onto a respective one of the plurality of data output signal paths, wherein each output driver circuit further includes a first p-type transistor coupled between an input of the output inverter driver and the unswitched voltage domain, and wherein the p-type transistor is configured to provide a path from the unswitched voltage domain to the input of the output inverter driver in response to the first switched voltage domain being powered down.

17. The integrated circuit as recited in claim 16, wherein the output latch includes a second p-type transistor and an n-type transistor coupled in series with an input inverter gate between the first switched voltage domain and a circuit ground reference, wherein an output of the input inverter gate is coupled to the input of the output inverter driver, and wherein the second p-type transistor and the n-type transistor are configured to turn off in response to the first and the second storage arrays being placed in an inactive state, thereby removing a current path from the unswitched voltage domain through the input inverter to circuits coupled to the first switched voltage domain, and removing a current path from the unswitched voltage domain through the input inverter to the circuit ground reference.

18. The integrated circuit as recited in claim 16, wherein the output latch includes a second p-type transistor and an n-type transistor coupled in series with a feedback circuit between the first switched voltage domain and a circuit ground reference, wherein the second p-type transistor and the n-type transistor are configured to turn off in response to receiving a power down indication that is indicative of the first switched voltage domain being powered down, thereby removing a current path from the unswitched voltage domain through the feedback circuit to the first switched voltage domain, and removing a current path from the unswitched voltage domain through the feedback circuit to the circuit ground reference.

19. The integrated circuit as recited in claim 14, wherein the valid logic level corresponds to a logic value of zero.

20. A mobile communication device comprising:
   a memory; and
   a processor coupled to the memory, wherein the processor includes an embedded memory including:
      a first storage array;
      a second storage array;
      a shared input/output (I/O) unit configured to provide output data from the first storage array and the second storage array via a plurality of data output signal paths;
      wherein the I/O unit includes an output latch configured to force a valid logic level on the plurality of data output signal paths in response to an indication that a first switched voltage domain that powers a first portion of the output latch is being powered down.

21. The mobile communication device as recited in claim 20, wherein a second portion of the output latch is coupled to an unswitched voltage domain configured to provide power as long as voltage is applied to the communication device.

22. The mobile communication device as recited in claim 21, wherein the output latch includes a respective output inverter driver for each of the plurality of data output signal paths, wherein each respective output inverter driver is configured to drive the output data onto one of the plurality of data output signal paths, wherein each output driver circuit further includes a first p-type transistor coupled between an input of each output inverter driver and the unswitched voltage domain, and wherein the p-type transistor is configured to provide a path from the unswitched voltage domain to the input of each output inverter driver in response to the first switched voltage domain being powered down.

23. The mobile communication device as recited in claim 20, wherein the valid logic level corresponds to a logic value of zero.

* * * * *